United States Patent [19]
Uehara et al.

[11] Patent Number: 5,584,647
[45] Date of Patent: *Dec. 17, 1996

[54] OBJECT HANDLING DEVICES

[75] Inventors: Akira Uehara; Isamu Hijikata; Mitsuaki Minato, all of Kanagawa, Japan

[73] Assignee: Tokyo Ohka Kogyo Co., Ltd., Kawasaki, Japan

[*] Notice: The portion of the term of this patent subsequent to Jan. 28, 2009, has been disclaimed.

[21] Appl. No.: 6,162

[22] Filed: Jan. 19, 1993

Related U.S. Application Data

[60] Continuation of Ser. No. 791,035, Nov. 12, 1991, abandoned, which is a division of Ser. No. 406,796, Sep. 13, 1989, Pat. No. 5,083,896.

[30] Foreign Application Priority Data

Sep. 13, 1989 [JP] Japan .................................. 63-232077

[51] Int. Cl.$^6$ ............................................ B25J 9/06
[52] U.S. Cl. .................... 414/744.5; 414/222; 901/15
[58] Field of Search ..................... 414/736, 744.2, 414/744.5, 744.6, 222, 225, DIG. 1, DIG. 3, DIG. 7, 786, 935, 937, 941; 901/8, 15; 74/479

[56] References Cited

U.S. PATENT DOCUMENTS

| | | | |
|---|---|---|---|
| 3,823,836 | 7/1974 | Cheney et al. | 414/225 |
| 3,874,525 | 4/1975 | Hassan et al. | 414/225 |
| 4,808,059 | 2/1989 | Eddy | 414/225 X |
| 4,897,015 | 1/1990 | Abbe et al. | 901/21 X |
| 5,083,896 | 1/1992 | Uehara et al. | 414/744.5 |

FOREIGN PATENT DOCUMENTS

| | | | |
|---|---|---|---|
| 58-60552 | 11/1983 | Japan . | |
| 62-36439 | 6/1987 | Japan | 414/DIG. 3 |

*Primary Examiner*—Donald W. Underwood
*Attorney, Agent, or Firm*—Merchant, Gould, Smith, Edell, Welter & Schmidt

[57] ABSTRACT

An object handling device successively transfers objects such as semiconductor wafers. The object handling device includes first and second collapsible arm units having hands for holding objects, a first drive shaft for selectively extending and contracting the first arm unit, a second drive shaft for selectively extending and contracting the second arm unit, a third drive shaft for turning the first and second arm units while keeping the first and second arm units in a relative positional relationship, the first, second, and third drive shafts being disposed coaxially with each other, and an actuator mechanism for angularly moving the first, second, and third drive shafts about their own axes independently of each other.

4 Claims, 7 Drawing Sheets

OBJECT HANDLING DEVICES

This is a continuation of application Ser. No. 07/791,035, filed Nov. 12, 1991, which was abandoned upon the filing hereof, which is a division of Ser. No. 07/406,796, filed Sep. 13, 1989, now U.S. Pat. No. 5,083,896, issued Jan. 28, 1992.

BACKGROUND OF THE INVENTION

1. Field of the Invention

The present invention relates to an object handling device for transferring objects such as semiconductor wafers.

2. Description of the Relevant Art

One known mechanism for transferring semiconductor wafers between the processing chamber of a plasma processing apparatus and a cassette which stores wafers is disclosed in Japanese Laid-Open Patent Publication No. 58-60552, for example.

The disclosed mechanism includes first and second feed means comprising belt conveyors which are located between the processing chamber and the cassette. The wafers stored in the cassette are brought one by one onto the belt conveyors, by which the wafers are delivered into the processing chamber. After the wafers have been processed, they are delivered out of the processing chamber and stored back into the cassette.

The conventional mechanism is however problematic in that the entire mechanism would become very complex if the direction of feed of the wafers between the processing chamber and the cassette were to change, and the reverse sides of the wafers are contaminated by dirt on the belt conveyors.

SUMMARY OF THE INVENTION

According to the present invention, there is provided an object handling device comprising a first collapsible arm unit having a hand for holding an object, a second collapsible arm unit having a hand for holding an object, a first drive shaft for selectively extending and contracting the first arm unit, a second drive shaft for selectively extending and contracting the second arm unit, a third drive shaft for turning the first and second arm units while keeping the first and second arm units in a relative positional relationship, the first, second, and third drive shafts being disposed coaxially with each other, and an actuator mechanism for angularly moving the first, second, and third drive shafts about their own axes independently of each other.

When motors of the actuator mechanism are energized to rotate the first and second drive shafts in one direction, the first and second arm units are extended to place a hand on a distal end of one of the arm units into a cassette to hold an unprocessed object, such as a semiconductor wafer, and also to position a hand on a distal end of the other arm unit into a processing chamber to hold a processed semiconductor wafer therein. Then, the motors are reversed to rotate the first and second drive shafts in the opposite direction for thereby contracting the first and second arm units. The third drive shaft is also rotated by another motor to switch around the first and second arm units. Thereafter, the first and second arm units are extended to place the processed semiconductor wafer back into the cassette and to feed the unprocessed semiconductor wafer into the processing chamber.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
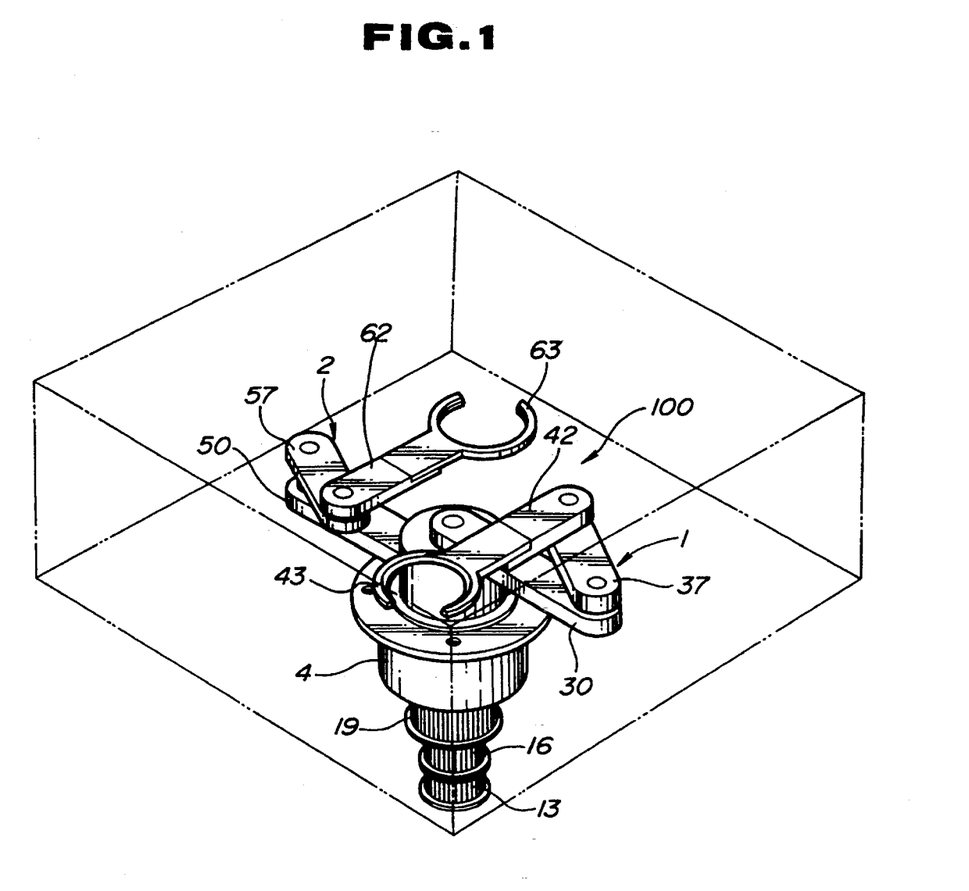
FIG. 1 is a perspective view of an object handling device according to the present invention.

As shown in FIG. 1, an object handling device 100 according to the present invention generally comprises an upper handling mechanism and a lower actuator mechanism. The handling mechanism includes a pair of first and second articulated arm units 1, 2. The actuator mechanism includes drive shafts and motors for extending, contracting, and turning the articulated arm units 1, 2.

Figure 2:
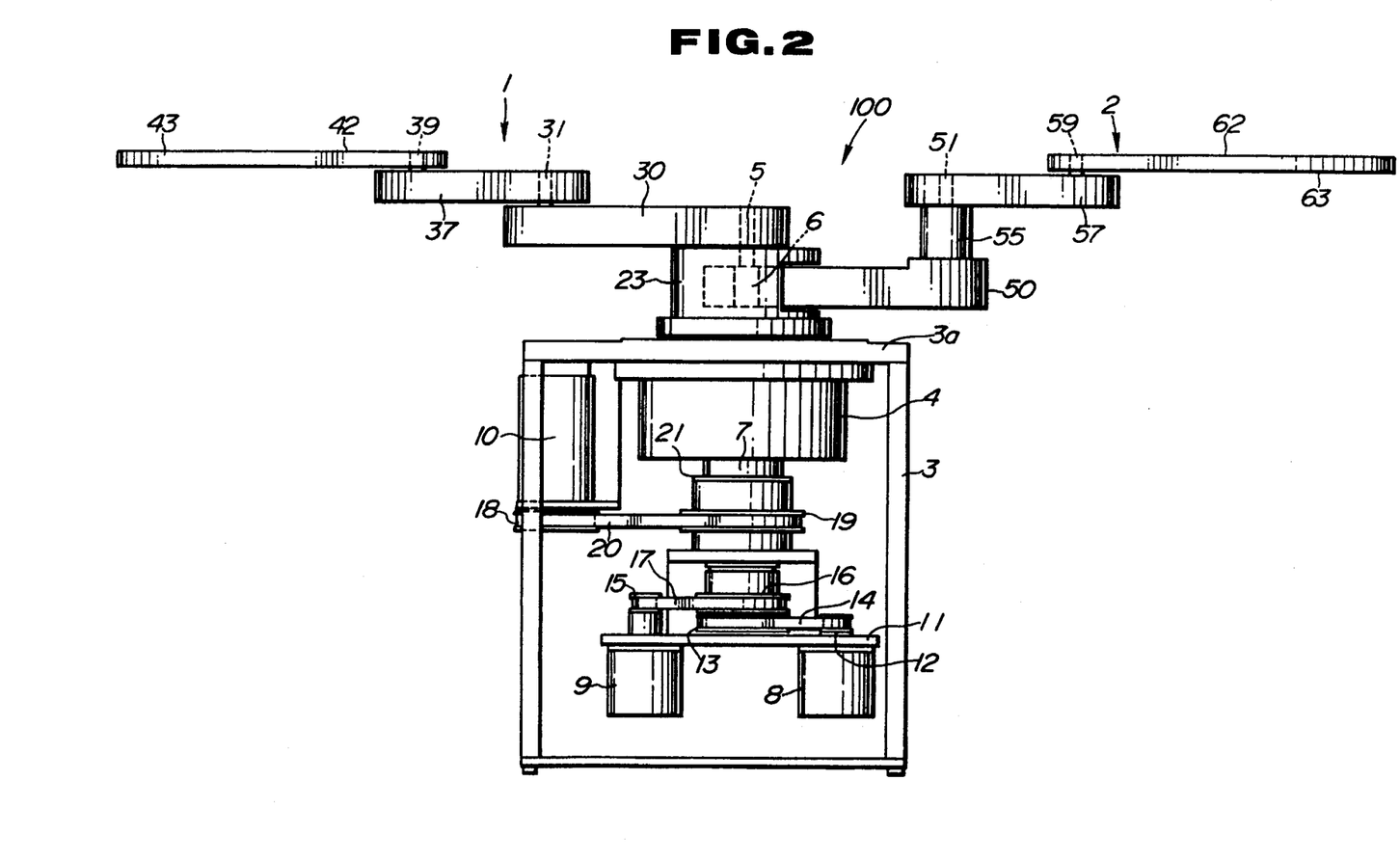
FIG. 2 is an enlarged front elevational view of the object handling device.

As shown in FIG. 2, the object handling device has a frame 3 including an upper panel 3a on which a bearing 4 is fixedly mounted. The actuator mechanism comprises a first drive shaft 5 for moving the first arm unit 1, a second hollow drive shaft 6 for moving the second arm unit 2, the second hollow drive shaft 6 being fitted over the first drive shaft 5, and a third drive shaft 7 for angularly moving the first and second arm units 1, 2 simultaneously, the third drive shaft 7 being fitted over the second drive shaft 6. The first second and third drive shafts 5, 6, 7 are coaxially and independently rotatably supported by the bearing 4.

Figure 5:
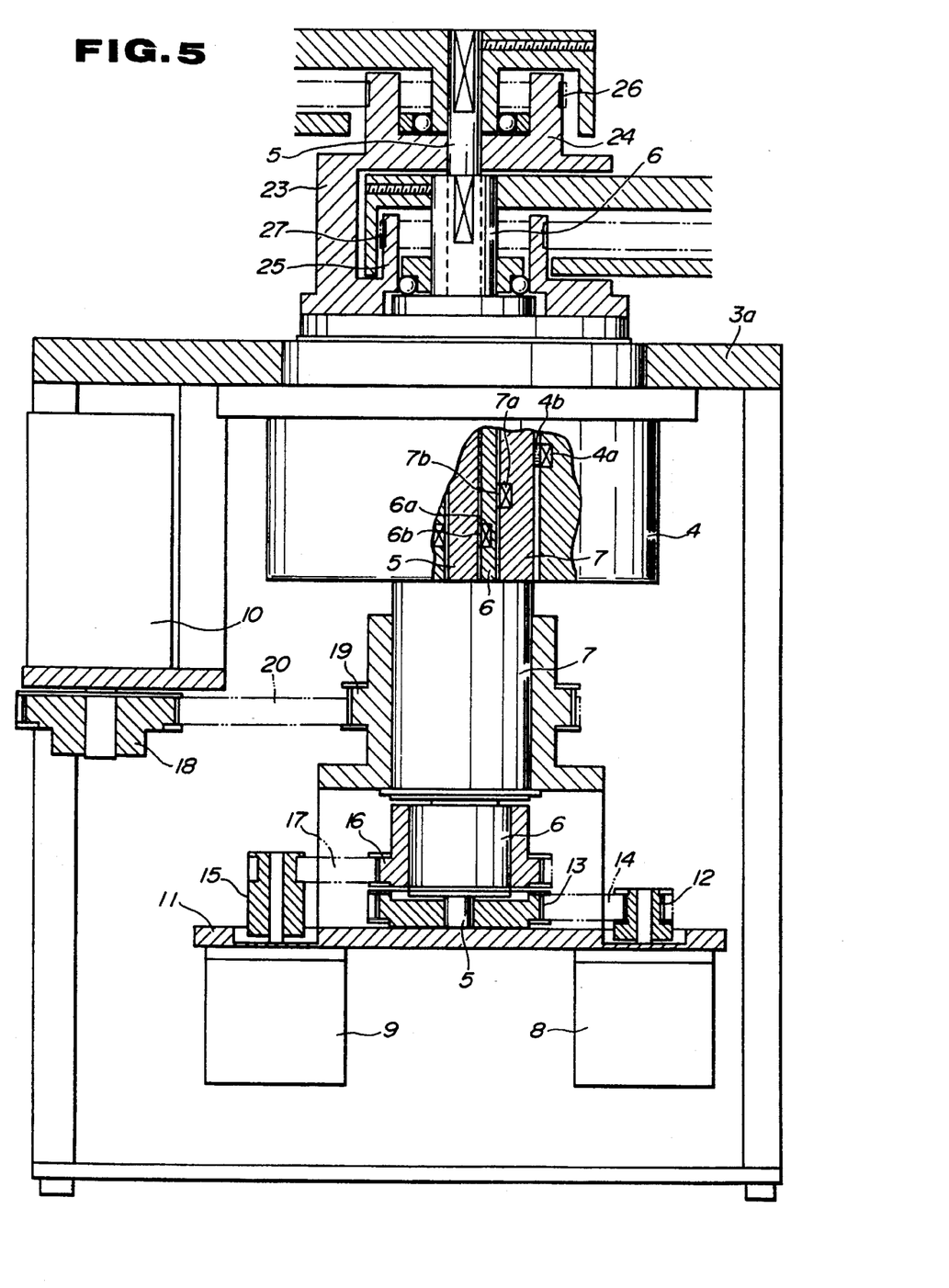
FIG. 5 is an enlarged elevational view, partly in cross section, of an actuator mechanism of the object handling device.

As illustrated in FIG. 5, magnetic fluid seals comprising magnets 4a, 6a, 7a and magnetic fluids 4b, 6b, 7b are disposed between the first, second, and third drive shafts 5, 6, 7, thus hermetically sealing the handling mechanism and the actuator mechanism from each other. Therefore, the handling mechanism may be positioned within a vacuum chamber whereas the actuator mechanism may be positioned outside of the vacuum chamber. While the third drive shaft 7 is in the outermost position, the second drive shaft 6 is located inside of the third drive shaft 7, and the first drive shaft 5 is in the innermost position, these drive shafts may be constructed such that they are located in other positional relationship.

The actuator mechanism comprises a first motor 8 for rotating the first drive shaft 5, a second motor 9 for rotating the second drive shaft 6, and a third motor 10 for rotating the third drive shaft 7. The first and second motors 8, 9 are mounted on a support 11 which is fixed to and rotatable with the third drive shaft 7. Therefore, the first and second motors 8, 9 revolve around the first drive shaft 5 upon rotation of the first drive shaft 5. An anti-backlash type timing belt 14 is trained around a toothed pulley 12 fixedly fitted over the output shaft of the first motor 8 and a toothed pulley 13 fixedly fitted over the first drive shaft 5. Likewise a timing belt 17 is trained around a toothed pulley 15 fixedly fitted over the output shaft of the second motor 9 and a teethed pulley 16 fixedly fitted over the drive shaft 6. A timing belt 20 is trained around a toothed pulley 18 fixedly fitted over the output shaft of the third motor 10 and a toothed pulley 19 fixedly fitted over the third drive shaft 7. Consequently, the rotative forces from the motors 8, 9, 10 are independently transmitted to the corresponding drive shafts 5, 6, 7.

The timing belts and toothed pulleys, illustrated as transmitting means for transmitting the rotative forces from the motors 8, 9, 10 to the respective drive shafts 5, 6, 7, may be any of various other means such as gears.

Figure 6:
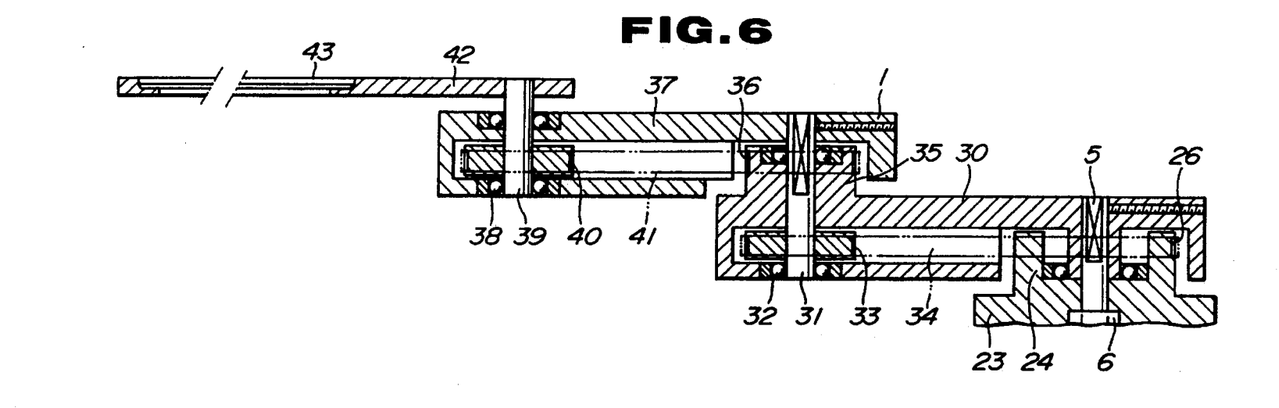
FIGS. 6 and 7 are enlarged fragmentary cross-sectional views of the arm units.
Figure 7:
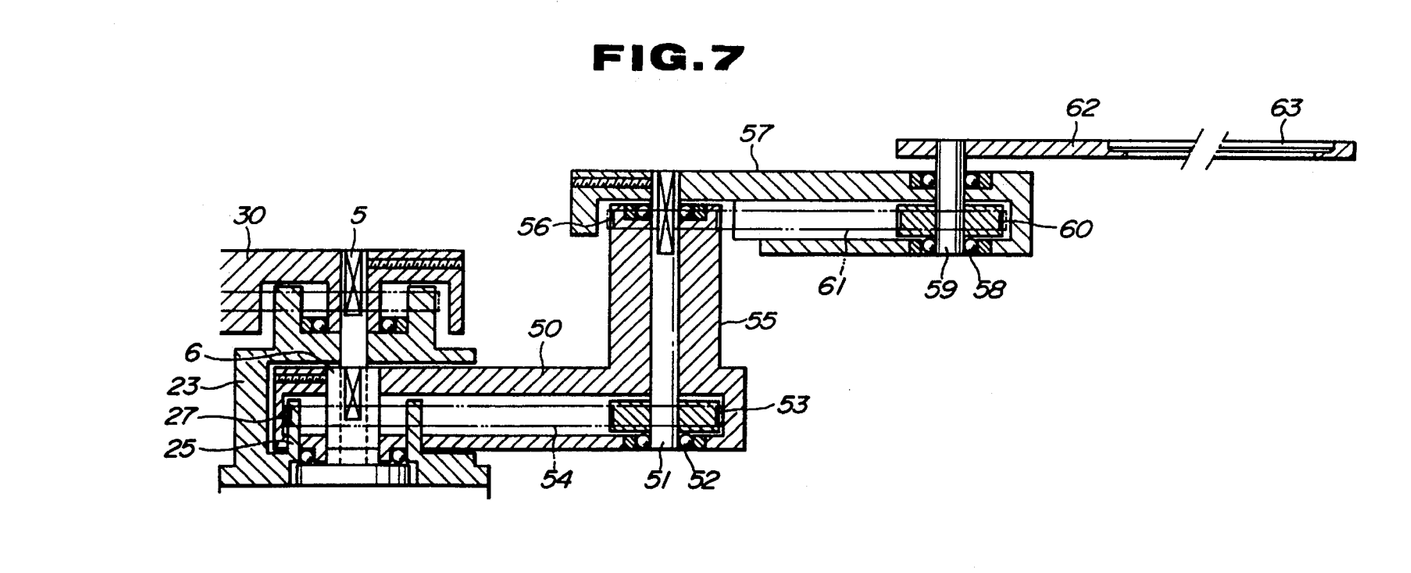

The first and second arm units 1, 2 will be described in detail with reference to FIGS. 5, 6, and 7.

A case 23 is mounted on the upper end of the third drive shaft 7, and includes upper and lower tubular portions 24, 25 extending coaxially with the third drive shaft 7. The tubular portions 24, 25 have respective toothed pulleys 26, 27 on their outer circumferential surfaces. The first drive shaft 5 has an upper end projecting above the tubular portion 24. As shown in FIG. 6, the first arm unit 1 includes a first hollow arm member 30 having a proximal end mounted on the upper projecting end of the first drive shaft 5. A pivot shaft 31 is rotatably supported on the distal end of the first arm member 30 by a bearing 32. A timing belt 34 is trained around a pulley 33 fixedly fitted over the pivot shaft 31 and the toothed pulley 26 of the tubular portion 24. The distal end of the first arm member 30 has a tubular portion 35 on its upper surface which is held coaxially with the pivot shaft 31. The tubular portion 35 has a toothed pulley 36 on its outer circumferential surface. The pivot shaft 31 has an upper end projecting above the tubular portion 35. A second hollow arm member 37 is attached to the upper projecting end of the pivot shaft 31. A pivot shaft 39 is rotatably supported on the distal end of the second arm member 37 by a bearing 38. A timing belt 41 is trained around a toothed pulley 40 fixedly fitted over the pivot shaft 39 and the toothed pulley 36 of the tubular portion 35. A hand 42 is mounted at its proximal end on the upper end of the pivot shaft 39. The hand 42 has on its distal end a holder 43 having a groove for receiving an object such as a semiconductor wafer, the holder 43 being of a partly annular shape.

The second arm unit 2 is of substantially the same structure as that of the first arm 1. As shown in FIG. 7, the second arm unit 2 has a hollow arm member 50 with its proximal end mounted on the upper end of the second drive shaft 6 which projects above the tubular portion 25. A pivot shaft 51 is rotatably supported on the distal end of the arm member 50 by a bearing 52. A timing belt 54 is trained around a toothed pulley 53 fixedly fitted over the pivot shaft 51 and the toothed pulley 27 of the tubular portion 25. The arm member 50 has an tubular portion 55 on the upper surface of the distal end thereof, the tubular portion 55 having a toothed pulley 56 on its outer circumferential surface. The pivot shaft 51 has an upper end which projects coaxially above the tubular portion 55 and which supports another hollow arm member 57. A pivot shaft 59 is rotatably supported on the distal end of the arm member 57 by a bearing 58. A timing belt 61 is trained around a toothed pulley 60 fixedly fitted over the pivot shaft 59 and the toothed pulley 56 of the tubular potion 55. A hand 62 which as a holder 63 on its distal end is mounted at its proximal end on the upper end of the pivot shaft 59.

Operation of the motors 8, 9, 10 and the arm units 1, 2 will be described below.

First, the first arm unit 1 will be described. The motor is is energized to rotate the first drive shaft 5 thereby rotating the arm member 30 in the direction indicated by the arrow a (counterclockwise), for example, in FIG. 3. When the arm member 30 is rotated in the direction indicated by the arrow a, the pulley 26 operates as a sun gear and the pulley 33 as a planet gear to cause the timing belt 34 to run over an interval depending on the angle through which the arm member 30 is angularly moved. The pulley 33 is thus angularly moved clockwise through a certain angle. Since the pulley 33 is turned clockwise, the arm member 37 is angularly moved in the direction indicated by the arrow b (clockwise) in FIG. 3. Upon the angular movement of the arm member 37, the pulley 36 rotates as a sun gear and a pulley 40 as a planet gear, thereby turning the hand 42 in the direction indicated by the arrow c (counterclockwise) in FIG. 3.

Figure 3:
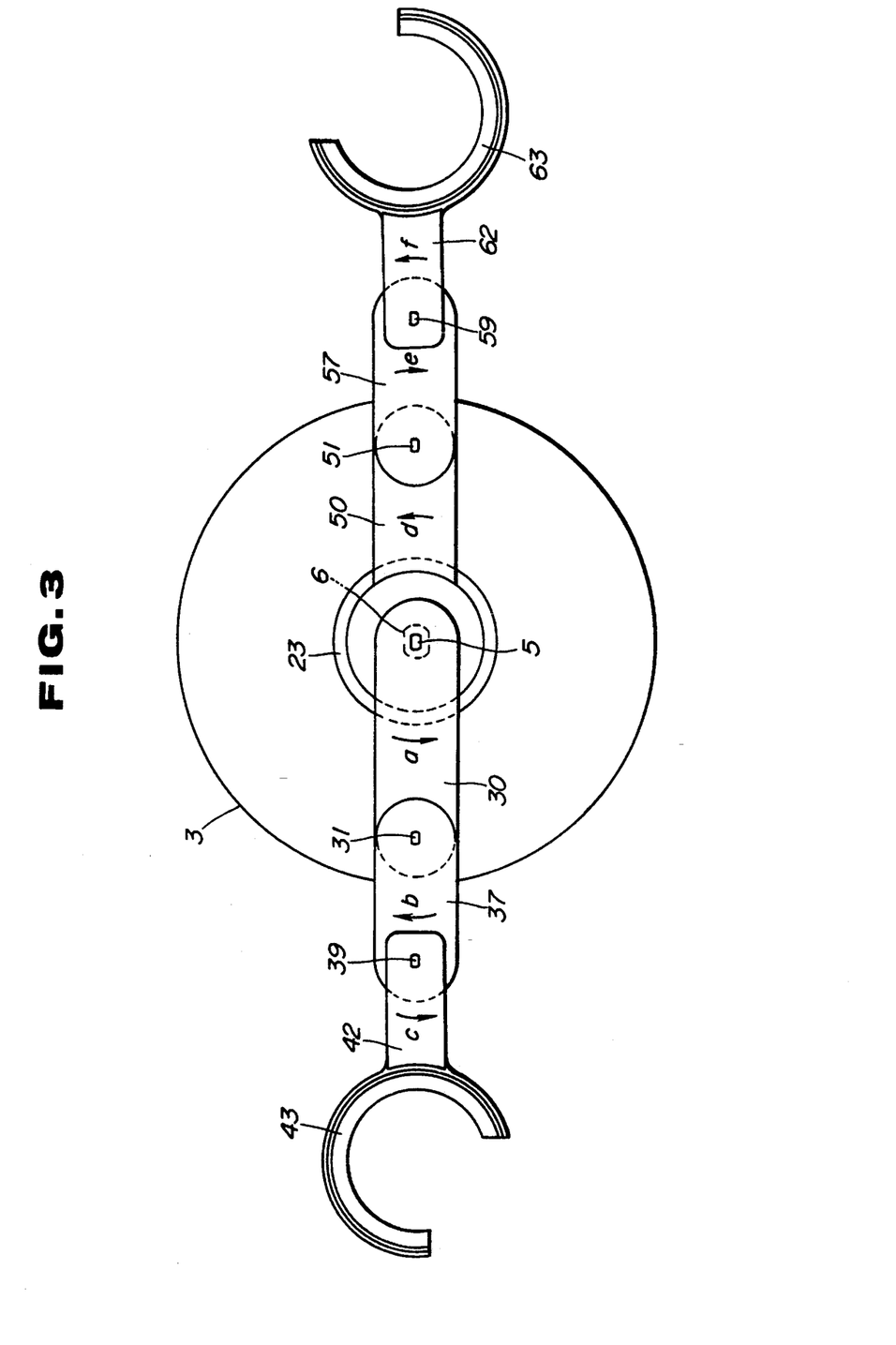
FIG. 3 is a plan view of the object handling device with arm units extended.

The second arm unit 2 operates similarly. More specifically, when the motor 9 is energized to turn the arm member 50 in the direction indicated by the arrow d (counterclockwise), the arm 57 is turned in the direction indicated by the arrow e, and the hand 62 is turned in the direction indicated by the arrow f.

Figure 4:
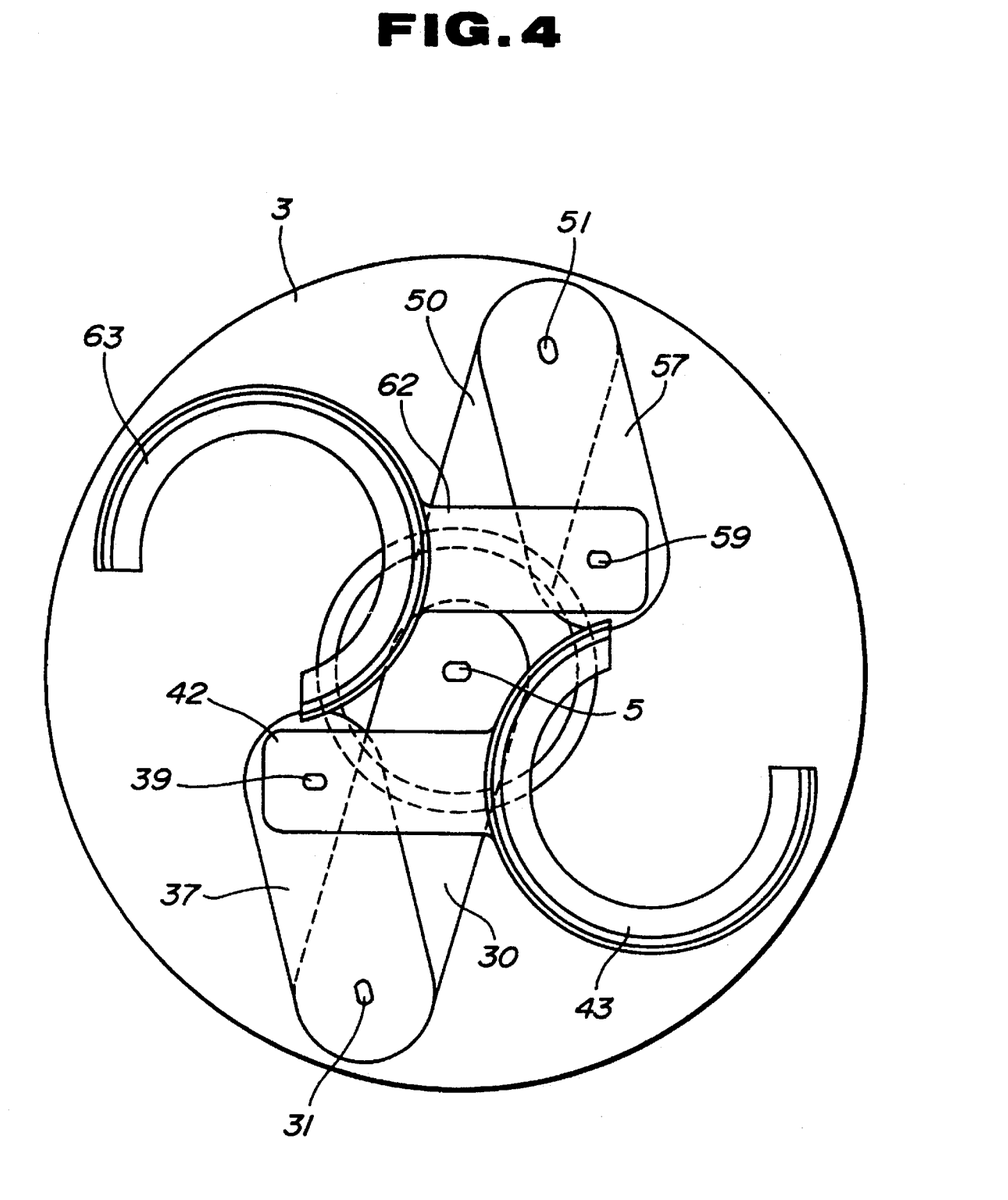
FIG. 4 is a plan view of the object handling device with the arm units contracted.

As a result, the first and second arm units 1, 2 are contracted from an extended position shown in FIG. 3 into a contracted position shown in PIG. 4. The first and second arm units 1, 2 can then be extended into the extended position of FIG. 3 by reversing the motors 8, 9.

When the third motor 10 is energized, the first and second arm units 1, 2 are angularly displaced to another angular position through 180°, for example, within a horizontal plane while keeping themselves in the same relative positional relationship. The above individual and relative movements of the first and second arm units 1, 2 are combined to transfer objects such as semiconductor wafers.

Figures 8, 9, 10:
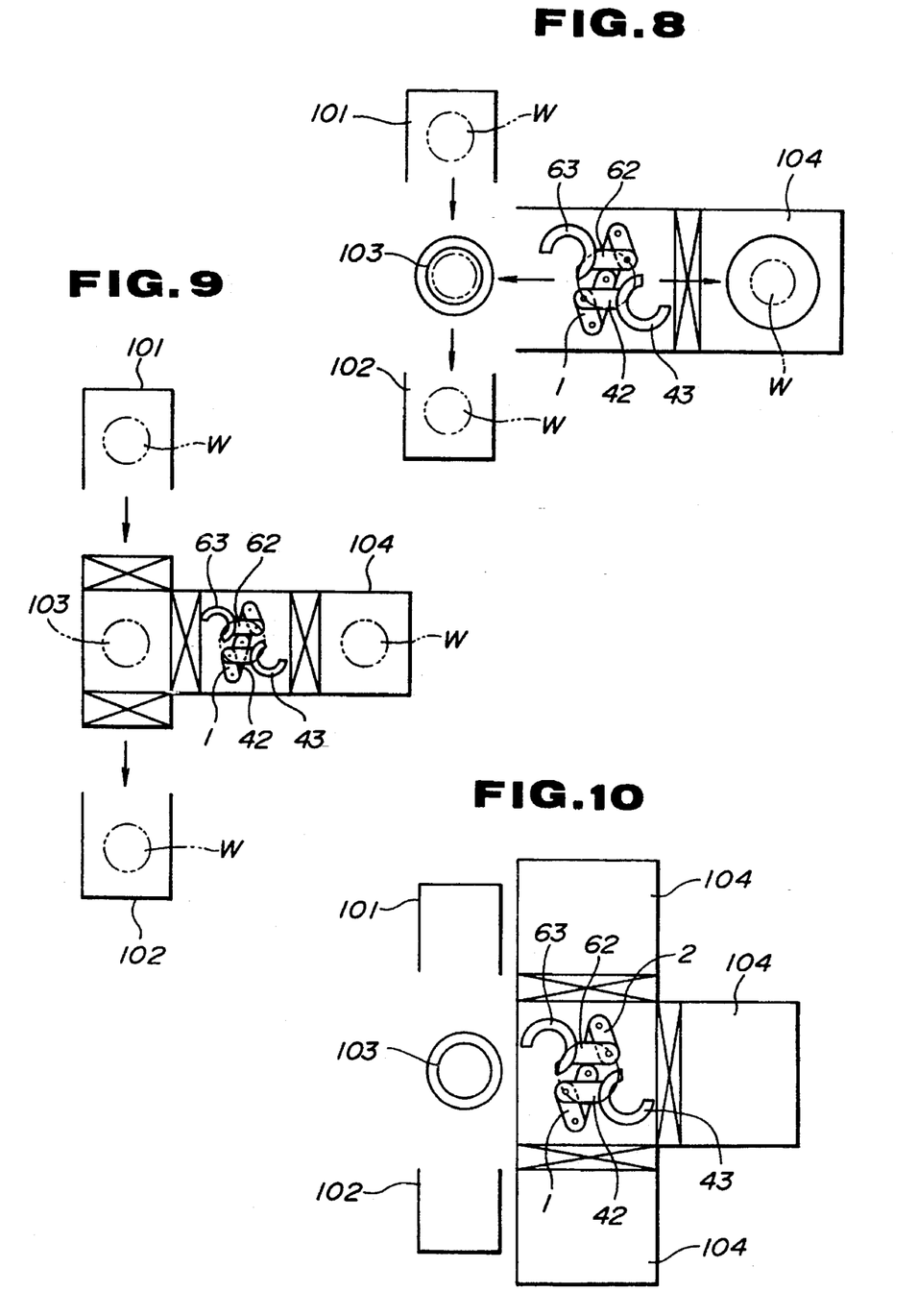
FIGS. 8, 9, and 10 are plan views showing the manner in which the object handling device is used.

FIG. 8 shows a plasma processing apparatus in plan. The plasma processing apparatus includes a cassette 101 for storing unprocessed semiconductor wafers W, a cassette 102 for storing processed semiconductor wafers W, and a transfer table 103 disposed between the cassettes 101,102. A processing vacuum chamber 104 is positioned on one side of the transfer table 103. The object handling device according to the present invention is placed between the processing chamber 104 and the transfer table 103.

One example of operation of the object handling device will be described with reference to FIG. 8. It is assumed that the holders 43, 63 of the hands 42, 62 of the first arm units 1, 2 are first in the contracted position, without holding wafers w. In operation, the first and second arms 1, 2 are extended from the contracted position. The holder 43 of the first arm unit 1 enters the processing chamber 104 and receives a processed wafer W. At the same time, the holder 63 of the second arm unit 2 receives an unprocessed wafer W which has been delivered from the cassette 101 to the transfer table 103. Then, the first and second arm units 1, 2 are contracted, and angularly moved 180° in the horizontal plane so that they are switched around. Thereafter, the first and second arm units 1, 2 are extended to place the unprocessed wafer W into the processing chamber 104 and also to put the processed wafer W on the transfer table 103. The processed wafer w is then delivered from the transfer table 103 back into the cassette 102, and a new unprocessed wafer w is supplied from the cassette 102 onto the transfer table 103. The above process is repeated to process a succession of semiconductor wafers W.

FIG. 9 shows another example of use in which the transfer table 103 is placed in a preliminary vacuum chamber and the object handing device of the invention is positioned in a processing vacuum chamber 104. FIG. 10 illustrates still another example of use in which three processing vacuum chambers 104 are disposed around the object handling device of the present invention.

Even with a plurality of processing chambers 104 employed, objects or semiconductor wafers W can be smoothly transferred by suitably selecting times during which to energize the motors 8, 9, 10, directions in which to rotate the arm members and hands, or ratios of the diameters of the pulleys which are operatively connected by the timing belts.

With the present invention, as described above, the object handling device allows the two arm units to move independently of each other without interfering with each other. Therefore, the object handling device can supply and receive objects efficiently. Inasmuch as the drive shafts for rotating the arm members are disposed coaxially with each other, the entire object handling device is made compact in size.

Although there has been described what is at present considered to be the preferred embodiment of the present invention, it will be understood that the invention may be embodied in other specific forms without departing from the essential characteristics thereof. The present embodiment is therefore to be considered in all aspects as illustrative, and not restrictive. The scope of the invention is indicated by the appended claims rather than by the foregoing description.

We claim:

1. A system for transferring semiconductor wafers to and from a plasma processor comprising:

(a) a first cassette for storing unprocessed semiconductor wafers;

(b) a second cassette, spaced apart from said first cassette, for storing processed semiconductor wafers;

(c) a transfer table disposed between said first and second cassettes and capable of temporarily receiving any one of said unprocessed semiconductor wafers to be transferred thereon from said first cassette and said processed semiconductor wafers to be transferred therefrom to said second cassette; and (d) a rotatable semiconductor wafer handling device disposed between said transfer table and plasma processor and rotatable between first and second positions, said wafer handling device including first and second arm means and first drive shaft means, each of said first and second arm means comprising a first arm member having a proximal end fixed to said drive shaft means for rotational movement with said drive shaft means, a second arm member having a proximal end pivotally coupled to a distal end of said first arm member, a hand for holding an object and having a proximal end pivotally coupled to a distal end of said second arm member, and drive link means for rotating said second arm member and hand to selectively extending and contracting the respective arm means, whereby in the first position said arm means picks a first semiconductor wafer from said plasma processor while said second arm means concurrently picks a second semiconductor wafer from said transfer table, and in the second position said first arm means places said first semiconductor wafer on said transfer table while said second arm means concurrently places said second semiconductor wafer in said plasma processor.

2. In a semiconductor wafer processing environment, a method for exchanging a processed wafer with an unprocessed wafer, said wafers residing coplanar at a first and a second station respectively, said stations being disposed 180° apart, and wherein an apparatus having at least one drive shaft means and at least two extendable arm means is disposed between said stations, said method comprising the steps of:

(a) simultaneously extending said arm means in opposite directions along substantially linear paths;

(b) simultaneously grasping said processed wafer from said first station and said unprocessed wafer from said second station with said arm means wherein each said arm means include a first arm member having a proximal end fixed to said drive shaft means for rotational movement with said drive shaft means, a second arm member having a proximal end pivotally coupled to a distal end of said first arm member, a hand having wafer grasping means at its distal end and having a proximal end pivotally coupled to a distal end of said second arm member, and drive link means for rotating said second arm member and hand for selectively extending and contracting the respective arm means;

(c) independently and simultaneously contracting said arm means in opposite directions along substantially linear paths;

(d) simultaneously rotating said arm means through 180°;

(e) simultaneously extending said arm means in opposite directions along substantially linear paths; and (f) simultaneously releasing said wafers from said grasping means while placing said processed wafer on said second station, and said unprocessed wafer on said first station.

3. A system as claimed in claim 1, wherein said rotatable semiconductor wafer handling device further comprises second drive shaft means for turning said first and second arm means while keeping the first and second arm means in a relative positional relationship, said first and second drive shaft means being disposed coaxially with each other, each of said first and second arm members further comprises a first pivot shaft fixed to a proximal end of said second arm member and rotatably supported on a distal end of said first arm member, a first pulley disposed coaxially on and rotatable with said second drive shaft means, and a second pulley fixedly fitted over said first pivot shaft, and said drive link means comprises a first timing belt trained around said first and second pulleys, whereby when said first shaft means is rotated, said first pulley rotates as a sun gear and said second pulley as a planet gear to rotate said second arm member for thereby selectively extending and contracting said each arm means.

4. A system as claimed in claim 3, wherein each of said first and second arm means further comprises a second pivot shaft fixed to a proximal end of said hand and rotatably supported on a distal end of said second arm member, a third pulley disposed on the distal end of said first arm member coaxially with said first pivot shaft, a fourth pulley fixedly fitted over said second pivot shaft, and said drive link means further comprises a second timing belt trained around said third and fourth pulleys, whereby when said first pivot shaft is rotated, said third pulley rotates as a sun gear and said fourth pulley as a planet gear to rotate said hand for thereby selectively extending and contracting each said arm means.

* * * * *

UNITED STATES PATENT AND TRADEMARK OFFICE
CERTIFICATE OF CORRECTION

PATENT NO. : 5,584,647

DATED : December 17, 1996

INVENTOR(S) : Akira Uehara; Isamu Hijikata; Mitsuaki Minato

It is certified that error appears in the above-identified patent and that said Letters Patent is hereby corrected as shown below:

Title page, item
[54] Title, delete "DEVICES" and insert --DEVICE--.

[60] Related Data, after the numeral "5,083,896" insert --, issued Jan. 28, 1992--.

Column 1, line 1 delete "DEVICES" and insert --DEVICE--.

Column 2, line 35, after the word "device" insert --100--.

Column 4, line 1, after the word "motor" insert --8--.

Column 4, line 2, delete "is" before the word "energized".

Column 4, line 25, delete the word "PIG." and insert --FIG.--.

Column 4, line 61, after the word "wafer" delete "w" and insert --W--.

Column 4, line 63, delete "w" and insert --W--.

Signed and Sealed this

Tenth Day of June, 1997

*Attest:*

BRUCE LEHMAN

*Attesting Officer*    Commissioner of Patents and Trademarks